United States Patent
Joshi et al.

(10) Patent No.: US 12,208,448 B2
(45) Date of Patent: Jan. 28, 2025

(54) TRANSIENT LIQUID PHASE BONDING COMPOSITIONS AND POWER ELECTRONICS ASSEMBLIES INCORPORATING THE SAME

(71) Applicant: Toyota Motor Engineering & Manufacturing North America, Inc., Plano, TX (US)

(72) Inventors: Shailesh N. Joshi, Ann Arbor, MI (US); Yanghe Liu, Ann Arbor, MI (US)

(73) Assignee: Toyota Motor Engineering & Manufacturing North America, Inc., Plano, TX (US)

( * ) Notice: Subject to any disclaimer, the term of this patent is extended or adjusted under 35 U.S.C. 154(b) by 739 days.

(21) Appl. No.: 17/411,615

(22) Filed: Aug. 25, 2021

(65) Prior Publication Data

US 2021/0381110 A1    Dec. 9, 2021

Related U.S. Application Data

(63) Continuation of application No. 15/700,712, filed on Sep. 11, 2017, now abandoned.

(51) Int. Cl.
*B23K 35/22*    (2006.01)
*B22F 1/17*    (2022.01)
(Continued)

(52) U.S. Cl.
CPC .............. *B22F 1/17* (2022.01); *B22F 3/1035* (2013.01); *B22F 7/064* (2013.01); *B23K 35/22* (2013.01);
(Continued)

(58) Field of Classification Search
None
See application file for complete search history.

(56) References Cited

U.S. PATENT DOCUMENTS 3,342,563 A    9/1967  Butts
3,545,944 A    12/1970 Emanuelson et al.
(Continued)

FOREIGN PATENT DOCUMENTS

CN    102596488 B    9/2013
CN    102888536 B    6/2015
JP    2017177156 A  * 10/2017

OTHER PUBLICATIONS

Cooke, Kavian O. et al., "Transient liquid phase diffusion bonding Al-6061 using nano-dispersed Ni coatings", Materials & Design, Jan. 2012; URL: http://www.sciencedirect.com/science/article/pii/S0261306911003207.
(Continued)

*Primary Examiner* — Devang R Patel
(74) *Attorney, Agent, or Firm* — Dinsmore & Shohl LLP

(57) ABSTRACT

A transient liquid phase (TLP) composition includes a plurality of first high melting temperature (HMT) particles, a plurality of second HMT particles, and a plurality of low melting temperature (LMT) particles. Each of the plurality of first HMT particles have a core-shell structure with a core formed from a first high HMT material and a shell formed from a second HMT material that is different than the first HMT material. The plurality of second HMT particles are formed from a third HMT material that is different than the second HMT material and the plurality of LMT particles are formed from a LMT material. The LMT particles have a melting temperature less than a TLP sintering temperature of the TLP composition and the first, second, and third HMT materials have a melting point greater than the TLP sintering temperature.

18 Claims, 8 Drawing Sheets

(51) Int. Cl.
    *B22F 3/10*            (2006.01)
    *B22F 7/06*            (2006.01)
    *C08K 3/08*            (2006.01)
    *C23C 18/16*          (2006.01)
    *H01L 23/00*          (2006.01)
    *H01L 23/373*         (2006.01)
    *C22C 1/04*            (2023.01)
    *H01L 23/36*          (2006.01)

(52) U.S. Cl.
    CPC ............ *C08K 3/08* (2013.01); *C23C 18/1633* (2013.01); *C23C 18/1635* (2013.01); *H01L 23/3736* (2013.01); *H01L 24/29* (2013.01); *H01L 24/83* (2013.01); *B22F 2301/30* (2013.01); *B22F 2999/00* (2013.01); *C08K 2003/085* (2013.01); *C22C 1/0416* (2013.01); *C22C 1/0425* (2013.01); *C22C 1/0433* (2013.01); *C22C 1/0466* (2013.01); *C22C 1/0483* (2013.01); *H01L 23/36* (2013.01); *H01L 24/00* (2013.01); *H01L 24/48* (2013.01); *H01L 24/73* (2013.01); *H01L 2224/29309* (2013.01); *H01L 2224/29311* (2013.01); *H01L 2224/29324* (2013.01); *H01L 2224/29339* (2013.01); *H01L 2224/29347* (2013.01); *H01L 2224/29355* (2013.01); *H01L 2224/29439* (2013.01); *H01L 2224/29447* (2013.01); *H01L 2224/29455* (2013.01); *H01L 2224/29499* (2013.01); *H01L 2224/32245* (2013.01); *H01L 2224/48091* (2013.01); *H01L 2224/48139* (2013.01); *H01L 2224/48247* (2013.01); *H01L 2224/48472* (2013.01); *H01L 2224/73265* (2013.01); *H01L 2224/83825* (2013.01); *H01L 2924/00014* (2013.01); *H01L 2924/10254* (2013.01); *H01L 2924/10272* (2013.01); *H01L 2924/10323* (2013.01); *H01L 2924/10325* (2013.01); *H01L 2924/1033* (2013.01); *H01L 2924/1203* (2013.01); *H01L 2924/13055* (2013.01); *H01L 2924/13091* (2013.01); *H01L 2924/19107* (2013.01)

(56) References Cited

U.S. PATENT DOCUMENTS

| | | | |
|---|---|---|---|
| 4,602,731 | A | 7/1986 | Dockus |
| 7,244,467 | B2 | 7/2007 | Grossman et al. |
| 7,565,996 | B2 * | 7/2009 | Das ........................ B23K 20/02 |
| | | | 228/248.1 |
| 9,343,425 | B1 * | 5/2016 | Joshi ........................ C22C 21/00 |
| 9,620,434 | B1 * | 4/2017 | Joshi ........................ H01L 24/29 |
| 2007/0089811 | A1 * | 4/2007 | Ikeda ....................... H01L 24/83 |
| | | | 148/536 |
| 2008/0083748 | A1 | 4/2008 | Thyssen et al. |
| 2015/0008253 | A1 * | 1/2015 | Yoon ........................ H01L 24/83 |
| | | | 228/179.1 |
| 2016/0108204 | A1 | 4/2016 | Joshi et al. |
| 2017/0062304 | A1 * | 3/2017 | Joshi ........................ H01L 24/00 |
| 2017/0080682 | A1 | 3/2017 | Joshi et al. |
| 2017/0095891 | A1 | 4/2017 | Anderson et al. |
| 2017/0263586 | A1 * | 9/2017 | Joshi ........................ H01L 24/32 |
| 2017/0368644 | A1 * | 12/2017 | Handwerker ........... H01L 24/00 |

OTHER PUBLICATIONS

"Nickel-Aluminum composite powders", Phelly Materials (U.S.A.) Inc., published/accessed: Jun. 16, 2017; URL: http://www.phelly.com/2007ThermalSpray/Nickel-Aluminum%20Powder.pdf.

Alhazaa, A.N. et al., "Transient liquid phase bonding of Magnesium alloys AZ31 using Nickel coatings and high frequency induction heat sintering", Journal of King Saud University—Science, Apr. 2016; URL: http://www.sciencedirect.com/science/article/pii/S1018364715000828.

"Reference Sheet: Melting Points", American Elements, https://www.americanelements.com/PDFs/reference/AE-melting-point-reference-sheet.pdf (Year: 2021).

\* cited by examiner

TRANSIENT LIQUID PHASE BONDING COMPOSITIONS AND POWER ELECTRONICS ASSEMBLIES INCORPORATING THE SAME

CROSS-REFERENCE TO RELATED APPLICATION

The present application is a continuation of and claims priority to U.S. patent application Ser. No. 15/700,712, filed Sep. 11, 2017 and entitled "TRANSIENT LIQUID PHASE BONDING COMPOSITIONS AND POWER ELECTRONICS ASSEMBLIES INCORPORATING THE SAME," which is incorporated by reference herein in its entirety.

TECHNICAL FIELD

The present specification generally relates to bonding materials, and more particularly, to transient liquid phase bonding materials for bonding of semiconductor devices to metal substrates during the manufacture of power electronics assemblies.

BACKGROUND

Power electronics devices are often utilized in high-power electrical applications, such as inverter systems for hybrid electric vehicles and electric vehicles. Such power electronics devices include power semiconductor devices, such as power IGBTs and power transistors thermally bonded to a metal substrate. The metal substrate may then be further thermally bonded to a cooling structure, such as a heat sink.

With advances in battery technology and increases in electronics device packaging density, operating temperatures of power electronics devices have increased and are currently approaching 200° C. Accordingly, traditional electronic device soldering techniques no longer provide suitable bonding of semiconductor devices to metal substrates and alternative bonding techniques are needed. One such alternative bonding technique is transient liquid phase (TLP) sintering (also referred to herein as "TLP bonding"). The TLP sintering of a power electronics device utilizes a bonding layer disposed (sandwiched) between a semiconductor device and metal substrate. The bonding layer at least partially melts and isothermally solidifies to form a TLP bond between the semiconductor device and metal substrate at TLP bonding temperatures (also referred to as sintering temperatures) between about 280° C. to about 350° C. The semiconductor devices and metal substrates have different coefficients of thermal expansion (CTE) and large thermally-induced stresses (e.g., cooling stresses) may be generated between a semiconductor device and metal substrate upon cooling from a TLP sintering temperature. The large thermal cooling stresses due to CTE mismatch between the power semiconductor device and metal substrate may result in delamination between the semiconductor device and metal substrate of a power electronics device when currently known bonding layers are used to form the TLP bond.

SUMMARY

In one embodiment, a transient liquid phase (TLP) composition includes a plurality of first high melting temperature (HMT) particles, a plurality of second HMT particles and a plurality of low melting temperature (LMT) particles. The plurality of first HMT particles have a core-shell structure with a core formed from a first HMT material and a shell formed from a second HMT material. The plurality of second HMT particles are formed from a third HMT material and the plurality of LMT particles are formed from a LMT material. The first HMT material may be nickel, silver, copper, aluminum, or an thickness alloy thereof. The second HMT material may be nickel, silver, copper, or an alloy thereof. The third HMT material made the nickel, silver, copper, aluminum, or an alloy thereof. The LMT material may be tin, indium, or an alloy thereof. The concentration of the LMT material in the TLP composition may be between about 25 weight percent (wt %) and about 75 wt %. An average diameter of the core of the plurality of first HMT particles may be between 10 micrometers (μm) and about 50 μm. The average thickness of the shell of the plurality of first HMT particles may be between about 0.5 μm and about 15 μm and an average diameter of the plurality of second HMT particles may be between about 5 micrometers (μm) and 50 μm. The TLP composition may be used to form a TLP bond layer disposed between and bonding together two components. In embodiments, the plurality of first HMT particles within the TLP bond layer have a graded average diameter along its thickness. In other embodiments, the TLP bond layer has a graded density of the plurality of first HMT particles along a thickness of the TLP bond layer.

In another embodiment, a power electronics assembly includes a semiconductor device extending across a metal substrate and a TLP bond layer disposed between the semiconductor device and the metal substrate. The TLP bond layer includes a plurality of first HMT particles, a plurality of second HMT particles, and a TLP intermetallic layer positioned between and TLP bonding together the plurality of first HMT particles, the plurality of second HMT particles, the semiconductor device and the metal substrate. Each of the plurality of first HMT particles has a core-shell structure with a core formed from a first HMT material and a shell formed from a second HMT material. Each of the plurality of second HMT particles is formed from a third HMT material. The first HMT material, the second HMT material, the third HMT material and the TLP intermetallic layer have a melting point greater than a TLP sintering temperature for forming the TLP bond layer from a TLP composition. The TLP bond layer may have a graded stiffness along its thickness. In embodiments, the TLP bond layer has localized stiffness variations at locations where the plurality of first HMT particles are positioned within the TLP bond layer. Also, the plurality of first HMT particles within the TLP bond layer may have a graded average diameter along a thickness of the TLP bond layer. In the alternative, or in addition to, the TLP bond layer may have a graded density of the plurality of first HMT particles along a thickness of the TLP bond layer. The first HMT material may be nickel, silver, copper, aluminum, or and alloys thereof. The second HMT material may be nickel, copper, silver, or an alloy thereof. The third HMT material made the nickel, silver, copper, aluminum, or an alloy thereof and the TLP intermetallic layer may include tin.

In yet another embodiment, a process for manufacturing a power electronics assembly includes positioning a TLP bonding layer between a metal substrate and a semiconductor device to provide a metal substrate/semiconductor device assembly. The TLP bonding layer includes a plurality of first HMT particles, a plurality of second HMT particles, and a plurality of LMT particles. Each of the plurality of first HMT particles has a core-shell structure with a core formed from a first HMT material and a shell formed from a second HMT material. Each of the plurality of second HMT particles is formed from a third HMT material and each of the plurality of LMT particles is formed from a LMT material. The metal substrate/semiconductor device assembly is heated to a TLP sintering temperature and a TLP bond layer is formed between the metal substrate and a semiconductor device. The first HMT material, the second HMT material, and the third HMT material have a melting point above the TLP sintering temperature. The LMT material has a melting point below the TLP sintering temperature such that the plurality of LMT particles at least partially melt and form the TLP intermetallic layer between the plurality of first HMT particles, the plurality of second HMT particles, the metal substrate, and the semiconductor device. The TLP bond layer may have a graded stiffness between along its thickness. In embodiments, the plurality of first HMT particles within the TLP bond layer may have a graded average diameter along a thickness of the TLP bond layer. In the alternative, or in addition to, the TLP bond layer may each have a graded density of the plurality of first HMT particles along a thickness of the TLP bond layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Figure 2:
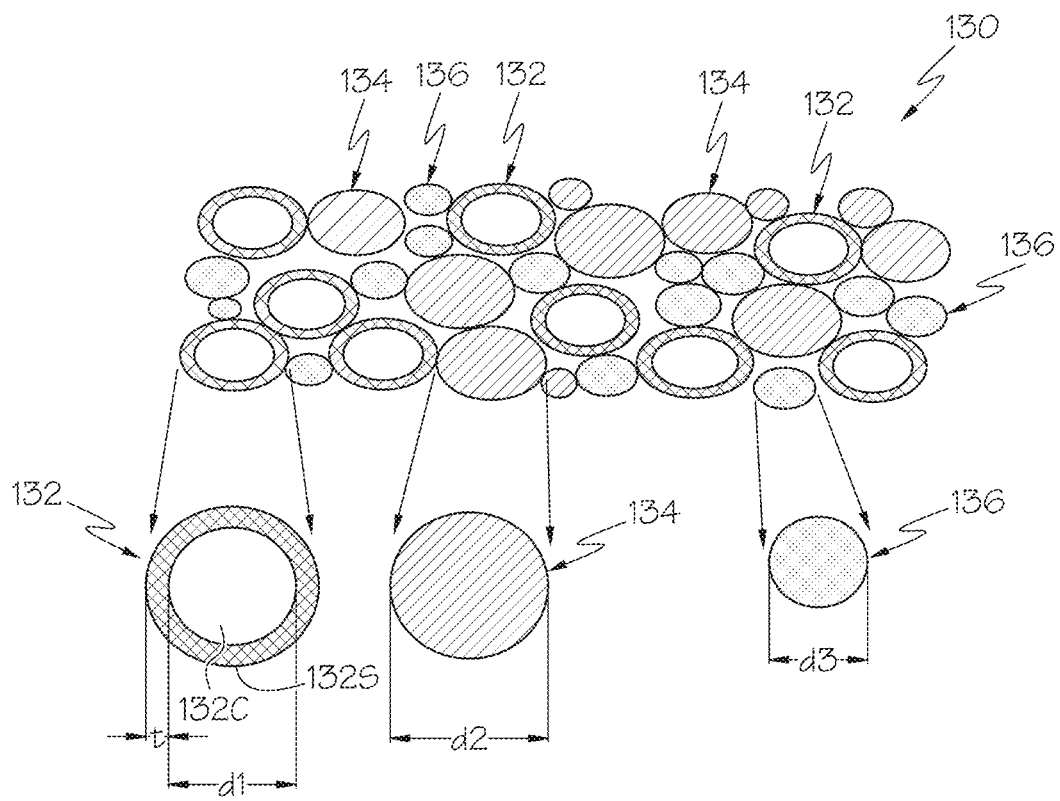
FIG. 2 schematically depicts a TLP composition used to provide a TLP bond layer according to one or more embodiments shown and described herein.

FIG. 2 generally depicts one embodiment of a transient liquid phase (TLP) composition. The TLP composition comprises a plurality of first high melting temperature (HMT) particles, a plurality of second HMT particles, and a plurality of low melting temperature (LMT) particles. The TLP composition may be used to form a TLP bond layer between a semiconductor and a metal substrate that compensates for thermally-induced stresses generated or resulting from fabrication and operation of a power electronics assembly. The thermally-induced stresses are due to coefficient of thermal expansion (CTE) mismatch between the semiconductor device and metal substrate of the power electronics assembly. Each of the plurality of first HMT comprises a core-shell structure with a core formed from a first high melting temperature (HMT) material and a shell formed from a second HMT material that is different than the first HMT material. Each of the plurality of second HMT particles is formed from a third HMT material that is different than the second HMT material. The plurality of first HMT particles provide for variations in stiffness and/or ductility along a thickness of the TLP bond layer that compensates for the thermally-induced stresses generated or resulting from fabrication and operation of the power electronics assembly. Various embodiments of TLP composition and power electronics assemblies using TLP bond layers will be described in more detail herein.

Figure 1:
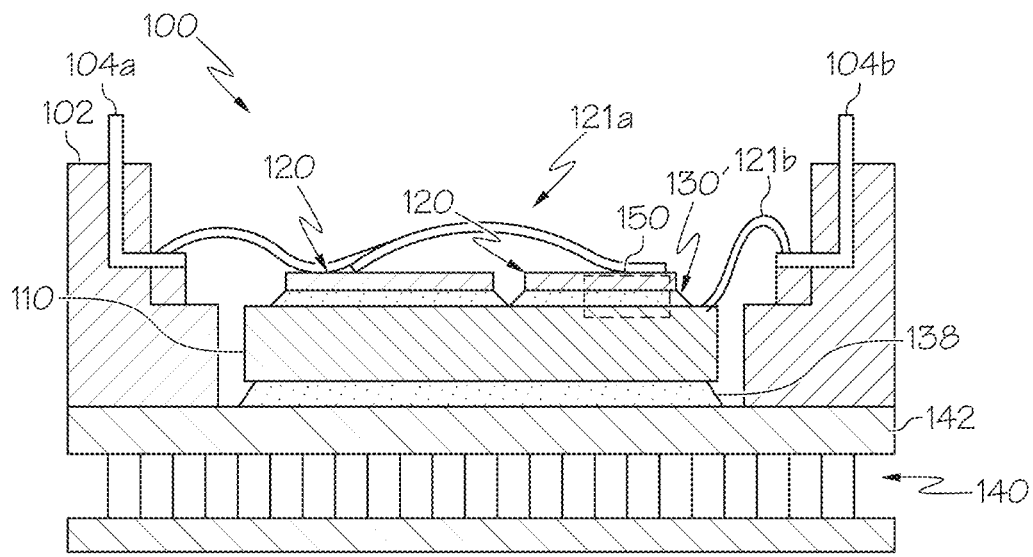
FIG. 1 schematically depicts a side view of a power electronics assembly having a power semiconductor device bonded to a metal substrate with a transient liquid phase (TLP) bond layer according to one or more embodiments shown and described herein.

Referring initially to FIG. 1, one non-limiting of a power electronics assembly 100 is illustrated. The example power electronics assembly 100 generally comprises a metal substrate 110, two semiconductor devices 120 bonded to the metal substrate 110 via a TLP bond layer 130', a cooling structure 140, and a package housing 102.

The thicknesses of the metal substrate 110 and the semiconductor devices 120 may depend on the intended use of the power electronics assembly 100. In one embodiment, the metal substrate 110 has a thickness within the range of about 2.0 mm to about 4.0 mm, and the semiconductor device 120 has a thickness within the range of about 0.1 mm to about 0.3 mm. For example and without limitation, the metal substrate may have a thickness of about 3.0 mm and the semiconductor device 120 may have a thickness of about 0.2 mm. It should be understood that other thicknesses may be utilized.

The metal substrate 110 may be formed from a thermally conductive material such that heat from the semiconductor devices 120 is transferred to the cooling structure 140. The metal substrate may be formed copper (Cu), e.g., oxygen free Cu, aluminum (Al), Cu alloys, Al alloys, and the like. The semiconductor devices 120 may be formed from a wide band gap semiconductor material suitable for the manufacture or production of power semiconductor devices such as power insulated-gate bipolar transistors (IGBTs), power metal-oxide-semiconductor field-effect transistors (MOSFETs), power transistors, and the like. In embodiments, the semiconductor devices 120 may be formed from wide band gap semiconductor materials including without limitation silicon carbide (SiC), silicon dioxide ($SiO_2$), aluminum nitride (AlN), gallium nitride (GaN), boron nitride (BN), diamond, and the like. In embodiments, the metal substrate 110 and the semiconductor devices 120 may comprise a coating, e.g., nickel (Ni) plating, to assist in the TLP sintering of the semiconductor devices 120 to the metal substrate 110.

As depicted in FIG. 1, a metal substrate 110 is bonded to two semiconductor devices 120 via the TLP bond layer 130'. More or fewer semiconductor devices 120 may be attached to the metal substrate 110. In some embodiments, heat generating devices other than power semiconductor devices may be attached to the metal substrate 110. The semiconductor devices 120 may be power semiconductor devices such as IGBTs, power diodes, MOSFETs, power transistors, and the like. In one embodiment, the semiconductor devices 120 of one or more power electronics assemblies are electrically coupled to form an inverter circuit or system for vehicular applications, such as for hybrid vehicles or electric vehicles, for example.

The metal substrate 110 is thermally coupled to the cooling structure 140 via a bond layer 138. In one embodiment, the cooling structure 140 comprises an air-cooled heat sink. In an alternative embodiment, the cooling structure 140 comprises a liquid-cooled heat sink, such as a jet impingement or channel-based heat sink device. The metal substrate 110 of the illustrated embodiment is directly bonded to a first surface 142 of the cooling structure 140 via the bond layer 138 without any additional interface layers (e.g., additional metal base plates). The metal substrate 110 may be bonded to the cooling structure 140 using a variety of bonding techniques, such as by TLP sintering, solder, brazing, or diffusion bonding, for example. However, in an alternative embodiment, one or more thermally conductive interface layers may be positioned between the metal substrate 110 and the cooling structure 140.

Still referring to FIG. 1, the metal substrate 110 may be maintained within a package housing 102, which may be made of a non-electrically conductive material such as plastic, for example. The package housing 102 may be coupled to the cooling structure 140 by a variety of mechanical coupling methods, such as by the use of fasteners or adhesives, for example.

Within the power electronics assembly 100 may be a first electrical contact 104a and a second electrical contact 104b to provide electrical power connections to the semiconductor devices 120. The first electrical contact 104a may correspond to a first voltage potential and the second electrical contact 104b may correspond to a second voltage potential. In the illustrated embodiment, the first electrical contact 104a is electrically coupled to a first surface of the semiconductor devices 120 via a first electrical wire 121a, and the second electrical contact 104b is electrically coupled to a second surface of the semiconductor devices 120 via a second electrical wire 121b and the metal substrate 110. It should be understood that other electrical and mechanical configurations are possible, and that embodiments are not limited by the arrangement of the components illustrated in the figures.

Referring now to FIG. 2, a schematic enlarged view of a TLP composition 130 used to form a TLP bonding layer 131 (FIG. 3) and the TLP bond layer 130' is illustrated. As used herein, the term "TLP bonding layer" refers to a layer of a TLP composition prior to TLP sintering and the term "TLP bond layer" refers to a TLP bonding layer after TLP sintering, i.e., a TLP layer that bonds one component such as, but not limited to, a semiconductor device to another component such as, but not limited to, a metal substrate. The TLP composition 130 includes a plurality of first HMT particles 132 (also referred to herein as "first HMT particles 132"), a plurality of second HMT particles 134 (also referred to herein as "second HMT particles 134"), and a plurality of low melting temperature (LMT) particles 136 (also referred to herein as "LMT particles 136"). In embodiments, the first HMT particles 132 are configured as binary particles with a core-shell structure comprising a core 132c formed from a first high melting temperature (HMT) material and a shell 132s positioned around the core 132c and formed from a second HMT material. In some embodiments, the shell 132s is positioned around and in direct contact with the core 132c. In other embodiments, the shell 132s is positioned around and not in direct contact with the core 132c. The second HMT particles 134 and the LMT particles 136 may not have a core-shell structure. The second HMT particles 134 are formed from a third HMT material and the LMT particles 136 are formed from a LMT material. It should be understood that not all of the particles in the TLP composition 130 are numbered for clarity and ease of illustration. It should also be understood that the particles may not be spherical in shape, and that they may take on arbitrary shapes. Although the particles of the compositions are described in the context of bonding, the use of such particles is not limited thereto. For example, the particles described herein may be implemented in a composite material application.

The LMT material of the LMT particles 136 has a melting temperature that is lower than that of the first and second HMT materials of the core 132c and shell 132s, respectively, of the first HMT particles 132, and the second HMT particles 134. Accordingly, the embodiment depicted in FIG. 2 provides for a ternary TLP composition 130 wherein the individual first HMT particles 132 and second HMT particles 134 bond with each other by diffusion of the LMT material of the LMT particles 136 into the HMT materials of the shell 132s of the first HMT particles 132 and the second HMT particles 134, which creates a high-temperature intermetallic alloy.

The example TLP composition 130 illustrated in FIG. 2 provides for the TLP bonding layer 131 (FIG. 3) that has a re-melting temperature that is greater than an initial melting temperature. As an example and not a limitation, the initial melting temperature (e.g., the bonding process temperature) may be less than about 250° C., while the re-melting temperature (e.g., a maximum operating temperature for a power semiconductor device bonded by the transient liquid phase composition) may be significantly higher.

Figure 3:
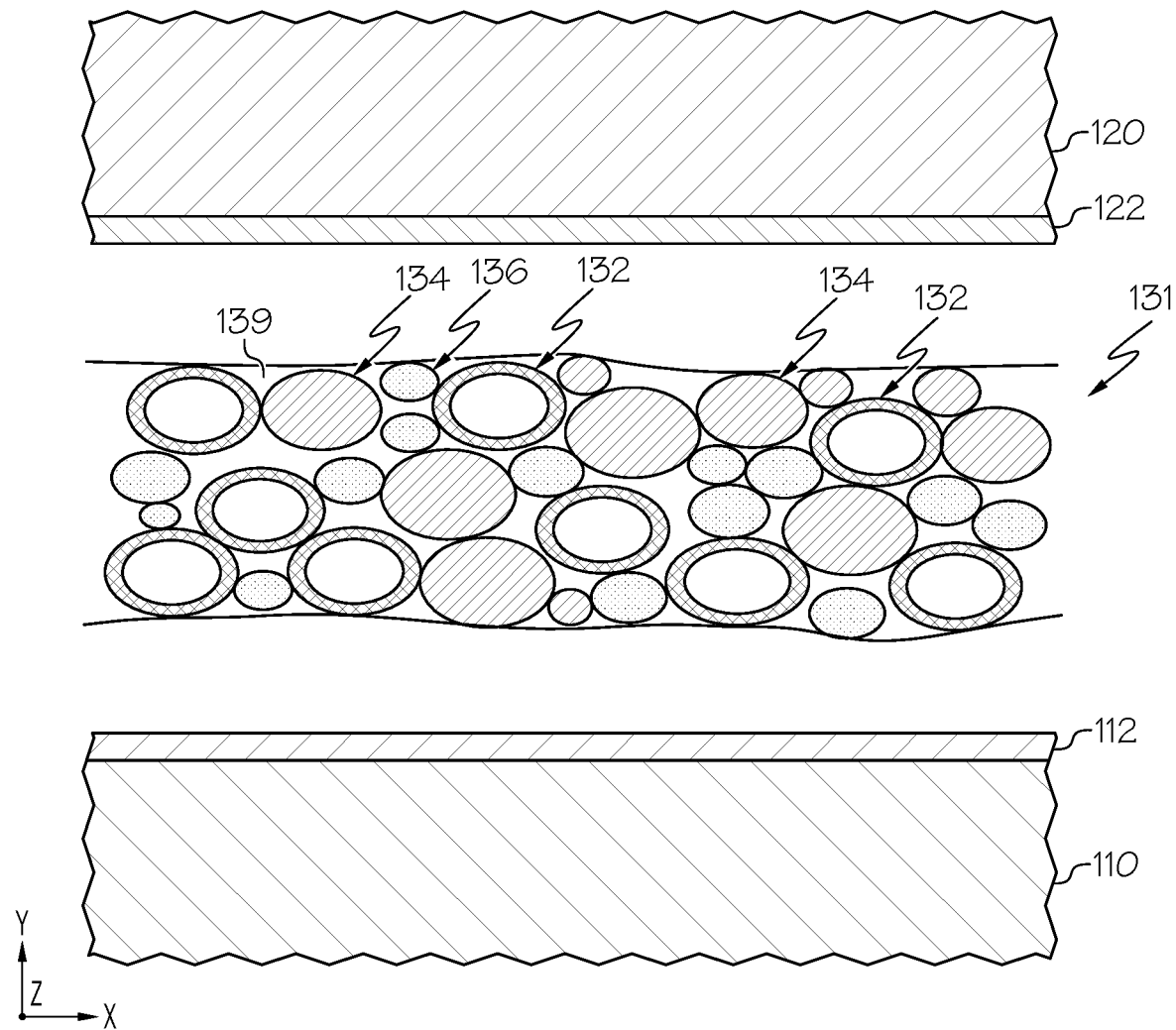
FIG. 3 schematically depicts an exploded view of FIG. 1 with a TLP bonding layer positioned between the metal substrate and the semiconductor device prior to TLP sintering according to one or more embodiments shown and described herein.

In embodiments, the plurality of first HMT particles 132, plurality of second HMT particles 134, and plurality of LMT particles 136 may be configured as loose particles in the form of a powder. In other embodiments, the plurality of first HMT particles 132, plurality of second HMT particles 134, and plurality of LMT particles 136 may be configured as a paste disposed in a binder 139 (FIG. 3). The binder 139 may be an inorganic binder, an organic binder, or a combination of an inorganic binder and an organic binder.

Example first HMT materials for the core 132c include of the first HMT particles 132, but are not limited to, nickel (Ni), silver (Ag), Cu, aluminum (Al), and alloys thereof. As used herein, the term "alloys thereof" refers to alloys not limited to the elements listed unless otherwise stated. For example, a Ni alloy as disclosed herein may include an alloy formed from Ni and elements other than Ag, Cu, and Al. In the alternative, a Ni alloy as disclosed herein may include an alloy formed from Ni with Ag, Cu, Cu and/or Al, plus additional elements. In another alternative, a Ni alloy as disclosed herein may include an alloy formed from only Ni and Ag, Cu and/or Al plus any incidental impurities present from manufacturing of the Ni alloy. Example second HMT materials for the shell 132s of the first HMT particles 132 include, but are not limited to, Ni, Ag, and alloys thereof. Example HMT materials for the second HMT particles 134 include, but are not limited to, Ni, Ag, Cu, and alloys thereof. It should be understood that the same material should not be chosen for both the core 132c and the shell 132s of the first HMT particles 132. Also, the second HMT particles 134 may be formed from a different HMT material than the shell 132s of the first HMT particles 132. Example LMT materials for the LMT particles 136 include, but are not limited to tin (Sn), indium (In), and alloys thereof.

Any known or yet-to-be-developed technique may be utilized to fabricate the first HMT particles 132 described herein. As non-limiting examples, the first HMT particles 132 described herein may be fabricated from electroplating, electroless plating, and other water-based processes.

The material for the core 132c of the first HMT particles 132 may be chosen to achieve desirable mechanical properties of the resulting TLP bond layer 130' following the initial melting of the TLP composition 130. For example, the material for the core 132c may be chosen to reduce the stiffness of the resulting TLP bond layer 130'. As used herein, the term "stiffness" refers to the elastic modulus (also known as Young's modulus) of a material, i.e., a measure of a material's resistance to being deformed elastically when a force is applied to the material. In the alternative, or in addition to, the material for the core 132c may be chosen to increase the ductility of the resulting TLP bond layer 130' thereby resulting in a less brittle bond between the metal substrate 110 and the semiconductor devices 120. As used herein, the term "ductility" refers to the plastic deformation of a material prior to failure, i.e., a measure of the material's ability to deform plastically without failing when a force is applied to the material. The second HMT particles 134 may be chosen to reduce a thermal expansion of the TLP bond layer 130' during operation of the power electronics assembly 100 and/or reduce a TLP sintering time for forming the TLP bond layer 130'. For example, the presence of Ni in the Cu—Sn system stabilizes the Cu intermetallic $Cu_6Sn_5$ as $(Cu,Ni)_6Sn_5$. Particularly, the binary intermetallic $Cu_6Sn_5$ exhibits an allotropic transformation from a monoclinic crystal structure to a hexagonal crystal structure with an approximate 2% volume expansion at about 186° C., whereas the ternary intermetallic $(Cu,Ni)_6Sn_5$ has a hexagonal crystal structure down to room temperature. Accordingly, there is no volume expansion associated with a change in crystal structure for the ternary intermetallic $(Cu, Ni)_6Sn_5$ when heated to elevated temperatures. Also, the presence of Ni increases the growth kinetics of the TLP intermetallic bonding layer thereby reducing the time for TLP sintering to form the TLP bond layer 130' that bonds the semiconductor devices 120 to the metal substrate 110. Particularly, diffusion within the ternary $(Cu, Ni)_6Sn_5$ intermetallic (diffusion rate=$202.5 \times 10^{-19}$ m$^2$/s at 150° C.) is about 11 times faster than within the binary $Cu_6Sn_5$ intermetallic (diffusion rate=$17.69 \times 10^{-19}$ m$^2$/s at 150° C.). Accordingly, the growth kinetics, and thus the TLP sintering time, for the TLP bond layer 130' may be significantly faster for a TLP bonding layer 131 that includes the second HMT particles 134.

The TLP compositions 130 described herein may be useful in power electronics applications (e.g., to bond a power semiconductor device to a cooling assembly in an inverter circuit of a hybrid or electric vehicles) because they have a high operating temperature (e.g., greater than 450° C.) and have a ductility (i.e., softness) comparable to traditional tin-based solder. Also, the TLP compositions 130 described herein may reduce the time at a TLP sintering temperature required to form the TLP bond layer 130' thereby reducing the time the semiconductor devices 120 are exposed to the TLP sintering temperature.

In one non-limiting example, the first HMT particles 132 comprise a core 132c formed from Al and a shell 132s formed from Ni, the second HMT particles 134 are formed from Cu, and the LMT particles 136 are formed from Sn. In another non-limiting example, the first HMT particles 132 comprise a core 132c formed from Cu a shell 132s formed from Ni, the second HMT particles are formed from Cu, and the LMT particles 136 are formed from Sn. In yet another non-limiting example, the first HMT particles 132 comprise a core 132c formed from Al and a shell 132s formed from Cu, the second HMT particles 134 are formed from Ni, and the LMT particles 136 are formed from Sn.

The concentration of the LMT particles 136 in the TLP composition 130 may be chosen to achieve a TLP bond layer 130' with desired mechanical properties as well as a desired re-melting temperature of the intermetallic compound after the initial melting process. The desired concentration of the LMT particles 136 may be achieved by selecting the diameter and thickness of the core 132c and shell 132s, respectively, of the first HMT particles 132, the diameter of the second HMT particles 134, and/or the diameter of the LMT particles 136. Particularly, and referring to FIGS. 2A-2C, the core 132c of the first HMT particles 132 has an average diameter 'd1' and the shell 132s has a thickness 't'. As used herein, the term "diameter" refers to an average of at least three diameter measurements for a given particle and the term "average diameter" refers to the summation of particle diameters for a given number of particles divided by the number of particles. The second HMT particles 134 have an average diameter 'd2' and the LMT particles 136 have an average diameter 'd3'. The average diameters d1, d2, and d3, and the thickness t, may be chosen to achieve the desired concentration of the LMT particles 136 in the TLP composition 130. Also, the diameters d1, d2, d3, and the thickness t, may be of any desired dimension. In embodiments, the concentration of the LMT particles 136, e.g., the concentration of Sn, in the TLP composition 130 is between 10 weight percent (wt %) and 75 wt %. For example, the concentration of the LMT particles 136 in the TLP composition 130 may be between 25 wt % and 75 wt %. In some embodiments, the concentration of the LMT particles 136 in the TLP composition 130 is between 25 wt % and 50 wt %. It should be understood that other dimensional characteristics may be used to achieve the desired concentration of the LMT particles 136 in the TLP composition 130. For example, first HMT particles 132, second HMT particles 134 and LMT particles 136 may be elongated particles (i.e., not generally spherical) and a maximum dimension (e.g., length) and/or an aspect ratio of such elongated particles may be chosen to achieve the desired concentration of the LMT particles 136 in the TLP composition 130.

Referring now to FIG. 3, an exploded view of the region designated by box 150 in FIG. 1 before bonding the semiconductor devices 120 to the metal substrate 110 is schematically depicted. In embodiments, the semiconductor device 120 is TLP bonded to the metal substrate 110 via a TLP bonding layer 131 formed from the TLP composition 130. In such embodiments, the metal substrate 110 may include a bonding layer 112 and the semiconductor device 120 may include a bonding layer 122. The TLP bonding layer 131 may be disposed between and in direct contact with the bonding layers 112, 122. The TLP bonding layer 131 includes the plurality of first HMT particles 132, the plurality of second HMT particles 134, and the plurality of LMT particles 136. In embodiments, the plurality of first HMT particles 132, the plurality of second HMT particles 134, and the plurality of LMT particles 136 are included within the binder 139. The binder 139 may be an inorganic binder, an organic binder, or a combination of inorganic binder and an organic binder.

The core 132c of the first HMT particles 132 may have an average diameter d1 between about 5 micrometers (m) and about 400 µm. For example, the core 132c may have an average diameter d1 greater than 5 µm, greater than 10 µm, greater than 15 µm, greater than 20 µm, greater than 25 µm, greater than 35 µm, greater than 50 µm, greater than 75 µm, greater than 100 µm, or greater than 150 µm, and less than 400 µm, less than 300 µm, less than 250 µm, less than 200 µm, less than 150 µm, or less than 100 µm. In embodiments, the core 132c has an average diameter d1 between about 10 µm and about 150 µm. For example, the core 132c may have an average diameter d1 between about 10 µm and about 100 µm. In some embodiments, the core 132c may have an average diameter d1 between about 10 µm and 50 µm. The thickness t of the shell 132s may be between about 0.2 µm and about 20 µm. For example, the thickness t of the shell 132s may be greater than 0.2 µm, greater than 0.5 µm, greater than 1.0 µm, greater than 2.5 µm, greater than 5.0 µm, greater than 10 µm, or greater than 15 µm, and less than 20 µm, less than 17.5 µm, less than 15 µm, less than 10 µm, or less than 7.5 µm. In embodiments, the thickness t of the shell 132s is between about 0.5 µm and 20 µm. In such embodiments, the thickness t of the shell 132s may be between about 0.5 µm and 15 µm.

The average diameter d2 of the second HMT particles 134 may be between about 5 µm and about 400 µm. For example, the average diameter d2 may be greater than 5 µm, greater than 10 µm, greater than 15 µm, greater than 20 µm, greater than 25 µm, greater than 35 µm, greater than 50 µm, greater than 75 µm, greater than 100 µm, or greater than 150 µm, and less than 400 µm, less than 300 µm, less than 250 µm, less than 200 µm, less than 150 µm, or less than 100 µm. In embodiments, the second HMT particles 134 have an average diameter d2 between about 5 µm and about 150 µm. For example, the second HMT particles 134 may have an average diameter d2 between about 5 µm and 100 µm. In some embodiments, the second HMT particles 134 may have an average diameter d2 between about 5 µm and 50 µm.

The average diameter d3 of the LMT particles 136 may be between about 5 µm and about 200 µm. For example, the average diameter d3 may be greater than 5 µm, greater than 10 µm, greater than 15 µm, greater than 20 µm, greater than 25 µm, greater than 50 µm, greater than 75 µm, greater than 100 µm, or greater than 150 µm, and less than 200 µm, less than 150 µm, less than 100 µm, or less than 75 µm. In embodiments, the LMT particles 136 have an average diameter d3 between about 10 µm and 150 µm. For example, the LMT particles 136 may have an average diameter d3 between about 15 µm and 100 µm. In some embodiments, these LMT particles 136 may have an average diameter d3 between about 25 µm and 75 µm.

The TLP sintering temperature and for the TLP bonding layer 131 may be between about 200° C. and about 400° C. As a non-limiting example, the TLP sintering temperature is between about 280° C. and about 350° C. and the LMT particles 136 have a melting point less than about 280° C. and the core 132c and shell 132s of the first HMT particles 132, and the second HMT particles 134, have melting points greater than 350° C. For example, the LMT particles 134 may be formed from Sn with a melting point of about 232° C., whereas the core 132c and shell 132s of the first HMT particles 132, and the second HMT particles 134, may be formed from materials such as Cu, Al, silver (Ag), zinc (Zn) and magnesium (Mg) with a melting point of about 1085° C., 660° C., 962° C., 420° C. and 650° C., respectively. Accordingly, the LMT particles 136 at least partially melt and the core 132c and shell 132s of the first HMT particles 132, and the second HMT particles 134, do not melt during TLP sintering of the TLP bonding layer 131.

Figure 4:
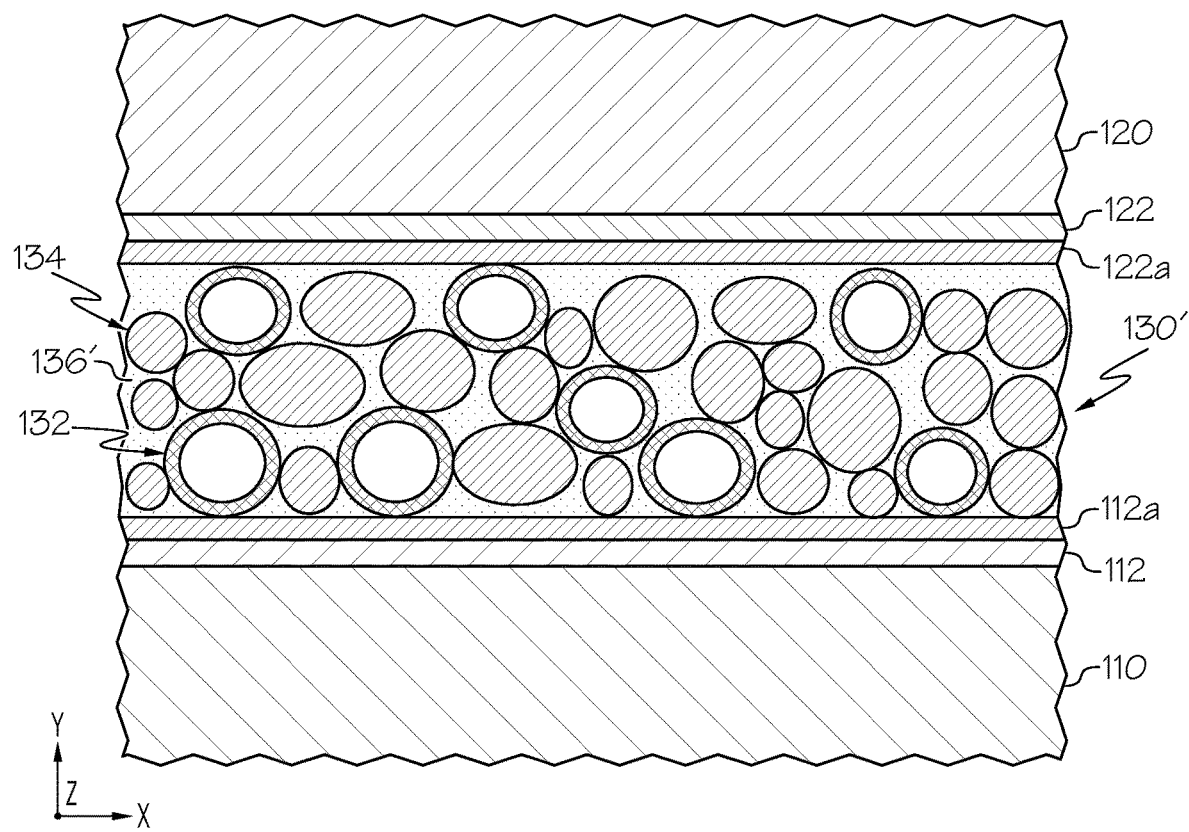
FIG. 4 schematically depicts an enlarged view of the TLP bond layer in FIG. 1 formed from the TLP bonding layer in FIG. 3 after TLP sintering.

Particularly, and referring now to FIG. 4, an exploded view of the region designated by box 150 in FIG. 1, after bonding of the semiconductor devices 120 to the metal substrate 110 via the TLP bond layer 130' is schematically depicted. The TLP bond layer 130' is formed from the LMT particles 136 at least partially melting and forming an intermetallic matrix 136'. In embodiments, the intermetallic matrix 136' may be in the form of an intermetallic layer. The intermetallic matrix 136' is formed between individual first HMT particles 132, between individual second HMT particles 134, and between adjacent first HMT particles 132. Also, the LMT particles 136 at least partially melt and diffuse into the bonding layers 112, 122 to form intermetallic layers 112a, 122a, respectively, between the metal substrate 110 and the TLP bond layer 130' and the semiconductor devices 120 and the TLP bond layer 130', respectively. Although the bonding layers 112, 122 depicted in FIG. 4 have not been totally consumed by the intermetallic layers 112a, 122a, respectively, in embodiments the intermetallic bond layers 112a and/or 122a may totally consume the bonding layers 112 and/or 122, i.e., only a single layer of the intermetallic layers 112a and/or 122a may be present after the TLP bond layer 130' is formed. In other embodiments, the TLP intermetallic bond layers 112a and/or 122a may comprise no layers, i.e., all of the bonding layers 112 and/or 122 diffuse into the TLP bond layer 130 up', metal substrate 110 and/or semiconductor device 120 thereby resulting in a clearly defined TLP intermetallic bond layer 112a and/or 122a not being present.

Figure 5:
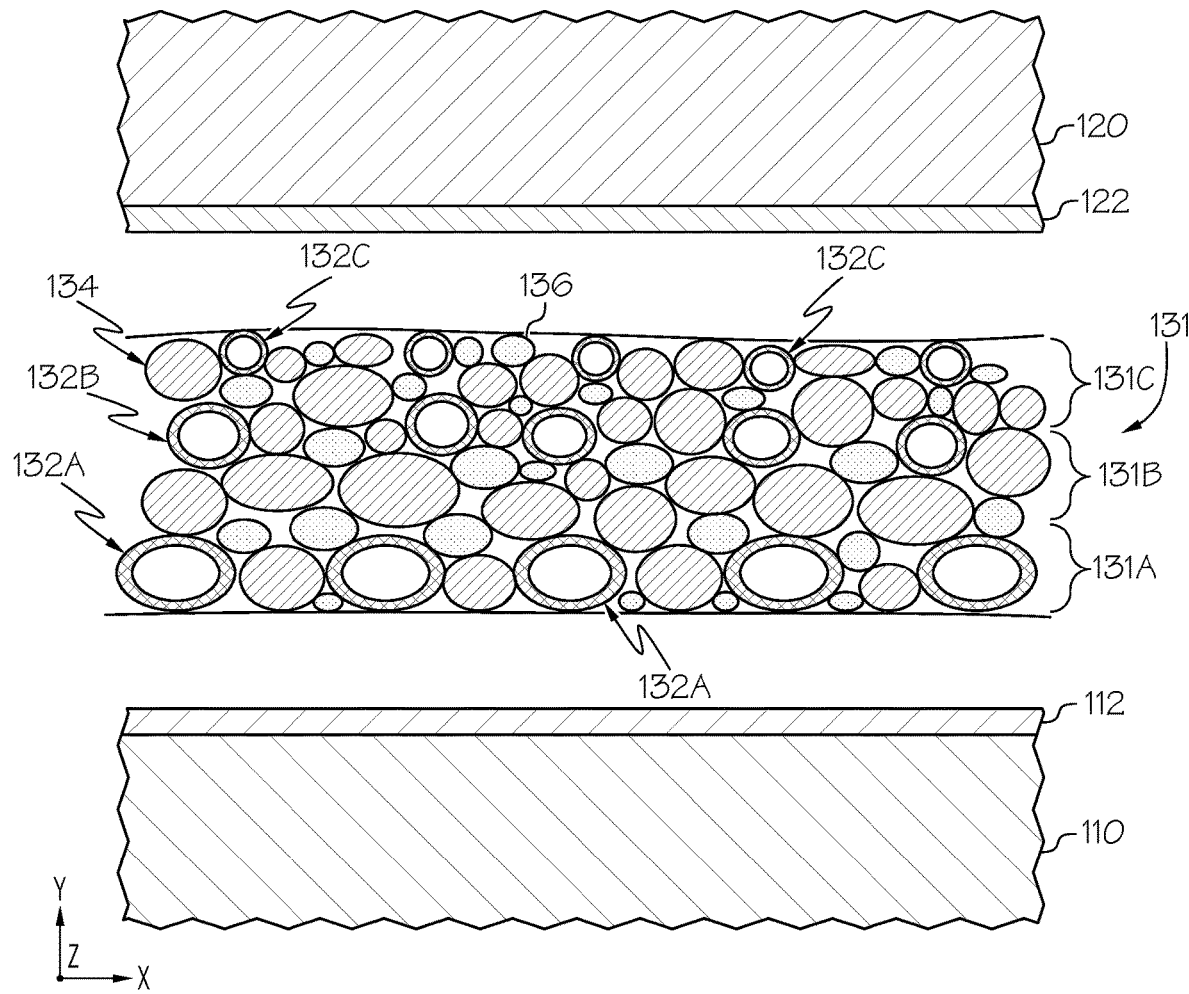
FIG. 5 schematically depicts an exploded view of FIG. 1 with a TLP bonding layer positioned between the metal substrate and the semiconductor device prior to TLP sintering according to one or more embodiments shown and described herein.
Figure 6:
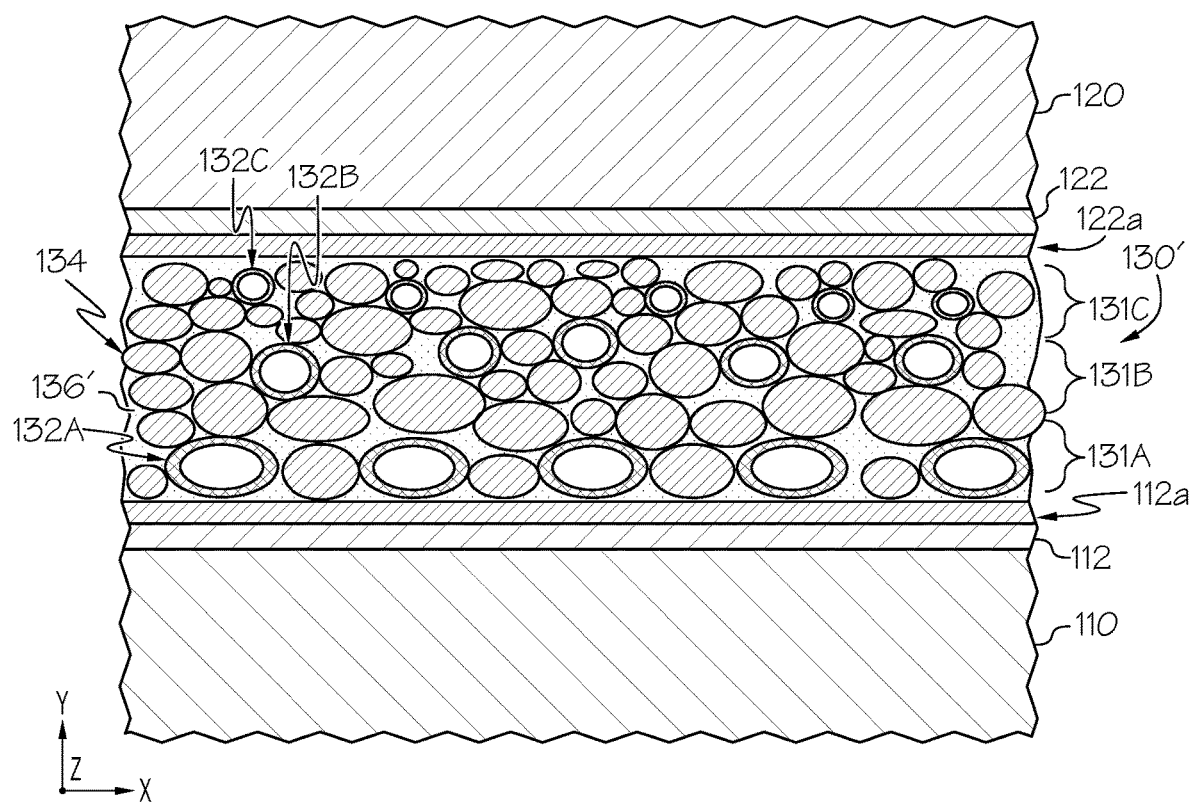
FIG. 6 schematically depicts an enlarged view of the TLP bond layer in FIG. 1 formed from the TLP bonding layer in FIG. 5 after TLP sintering.

While FIG. 4 schematically depicts the size (core 132c plus shell 132s) of the first HMT particles 132 being generally uniform, embodiments wherein the size of the first HMT particles 132 within a TLP bonding layer 131 and a TLP bond layer 130' is not generally uniform are included. Particularly, FIGS. 5 and 6 schematically depicts a TLP bonding layer 131 and a TLP bond layer 130', respectively, with the first HMT particles 132 having a graded average diameter along the thickness of the TLP bonding layer 131 and the TLP bond layer 130'. As used herein, the term "graded" refers to change as a function of distance. Also, it should be understood that the average diameter of a plurality of first HMT particles 132 is equal to an average diameter d1 of the cores 132c plus twice the average thickness (2·t) of the shells 132s for the plurality of first HMT particles 132. Referring particularly to FIG. 5, the TLP bonding layer 131 includes a first layer 131A wherein the first HMT particles 132 have a first average diameter (referred to herein as first HMT particles 132A), a second layer 131B wherein the first HMT particles 132 have a second average diameter that is less than the first average diameter (referred to herein as first HMT particles 132B), and a third layer 131C wherein the first HMT particles 132 have a third average diameter that is less than the second average diameter (referred to herein as first HMT particles 132C). As a non-limiting example, the first average diameter of the first HMT particles 132A may range between about 100 µm and 200 µm, the second average diameter of the first HMT particles 132B may range between about 75 µm and 150 µm, and the third average diameter of the first HMT particles 132C may range between 50 µm and 100 µm. Accordingly, the TLP bonding layer 131 depicted in FIG. 5 comprises first HMT particles 132 with a graded average diameter along the thickness (Y-direction) of the TLP bonding layer 131.

Referring now to FIG. 6, the TLP bond layer 130' formed from the TLP bonding layer 131 and thereby TLP bonding the semiconductor devices 120 to the metal substrate 110. As discussed above with respect to FIGS. 3 and 4, the TLP bond layer 130' is formed from the LMT particles 136 at least partially melting and forming an intermetallic matrix 136'. In embodiments, the intermetallic matrix 136' may be in the form of an intermetallic layer. The intermetallic matrix 136' is formed between individual first HMT particles 132, between individual second HMT particles 134, and between adjacent first HMT particles 132. Also, the LMT particles 136 at least partially melt and diffuse into the bonding layers 112, 122 to form intermetallic layers 112a, 122a, respectively, between the metal substrate 110 and the TLP bond layer 130' and the semiconductor devices 120 and the TLP bond layer 130', respectively. Although the bonding layers 112, 122 depicted in FIG. 6 have not been totally consumed by the intermetallic layers 112a, 122a, respectively, in embodiments the intermetallic bond layers 112a and/or 122a may totally consume the bonding layers 112 and/or 122, i.e., only a single layer of the intermetallic layers 112a and/or 122a may be present after the TLP bond layer 130' is formed. In other embodiments, the TLP intermetallic bond layers 112a and/or 122a may comprise no layers, i.e., all of the bonding layers 112 and/or 122 diffuse into the TLP bond layer 130 up', metal substrate 110 and/or semiconductor device 120 thereby resulting in a clearly defined TLP intermetallic bond layer 112a and/or 122a not being present.

Still referring to FIG. 6, it should be understood that the graded average diameter of the first HMT particles 132 along the thickness of the TLP bond layer 130' may provide a graded stiffness along the thickness of the TLP bond layer 130'. In the alternative, or in addition to, the graded average diameter of the first HMT particles 132 along the thickness of the TLP bond layer 130' may provide a graded ductility along the thickness of the TLP bond layer 130'. It should be understood that graded stiffness and/or ductility along the thickness of the (Y-direction) of the TLP bonding layer 130' may compensate for thermally-induced stresses, e.g., thermal cooling stresses between the metal substrate 110 and the semiconductor devices 120, resulting from fabrication (e.g., TLP sintering) and operational conditions (e.g., transient electric loads causing high changes in temperature) of the power electronics assembly 100.

The TLP bonding layer 131 with first HMT particles 132 having graded average diameters along the thickness of the TLP bonding layer 131 may be formed using known or yet-to-be developed techniques that position or lay down multiple layers of TLP compositions having first HMT particles 132 with different average diameters. One non-limiting example includes additive manufacturing (3D printing), i.e., a first layer 131A containing the first HMT particles 132A is deposited (3D printed) onto the metal substrate 110, a second layer 131B containing the first HMT particles 132B is deposited onto the first layer 131A, and then a third layer 131C containing the first HMT particles 132C is deposited onto the second layer 131B. Another non-limiting example includes positioning a first thin foil formed from the LMT material (not shown) with the first HMT particles 132A and second HMT particles 134 attached thereto onto the metal substrate 110, then positioning a second thin foil formed from the LMT material (not shown) with the first HMT particles 132B and second HMT particles 134 attached thereto onto the first thin foil, and then positioning a third thin foil formed from the LMT material (not shown) with the first HMT particles 132C and second HMT particles 134 attached thereto onto the second thin foil. It should be understood that the arrangement of the first layer 131A, the second layer 131B and the third layer 131C may be different than as depicted in FIGS. 5 and 6. That is, the TLP bonding layer 131 may be formed from any combination of layers having first HMT particles 132 with different average diameters such that the plurality of first HMT particles 132 have a graded average diameter along a thickness of the TLP bonding layer 131. For example and without limitation, the TLP bonding layer 131 may include a first layer 131A disposed between a pair of second layers 131B, a first layer 131A disposed between a pair of third layers 131C, a second layer 131B disposed between a pair of first layers 131A, a second layer 131B disposed between a pair of third layers 131C, a third layer 131C disposed between a pair of first layers 131A, a third layer 131C disposed between a pair of second layers 131B, or the like. It should also be understood that the TLP bonding layer 131 and the TLP bond layer 130' may include less than three layers or more than three layers, and the thicknesses of the layers, e.g., the thicknesses of the first layer 131A, the second layer 131B and the third layer 131C may be equal, or in the alternative, may not be equal.

Figure 7:
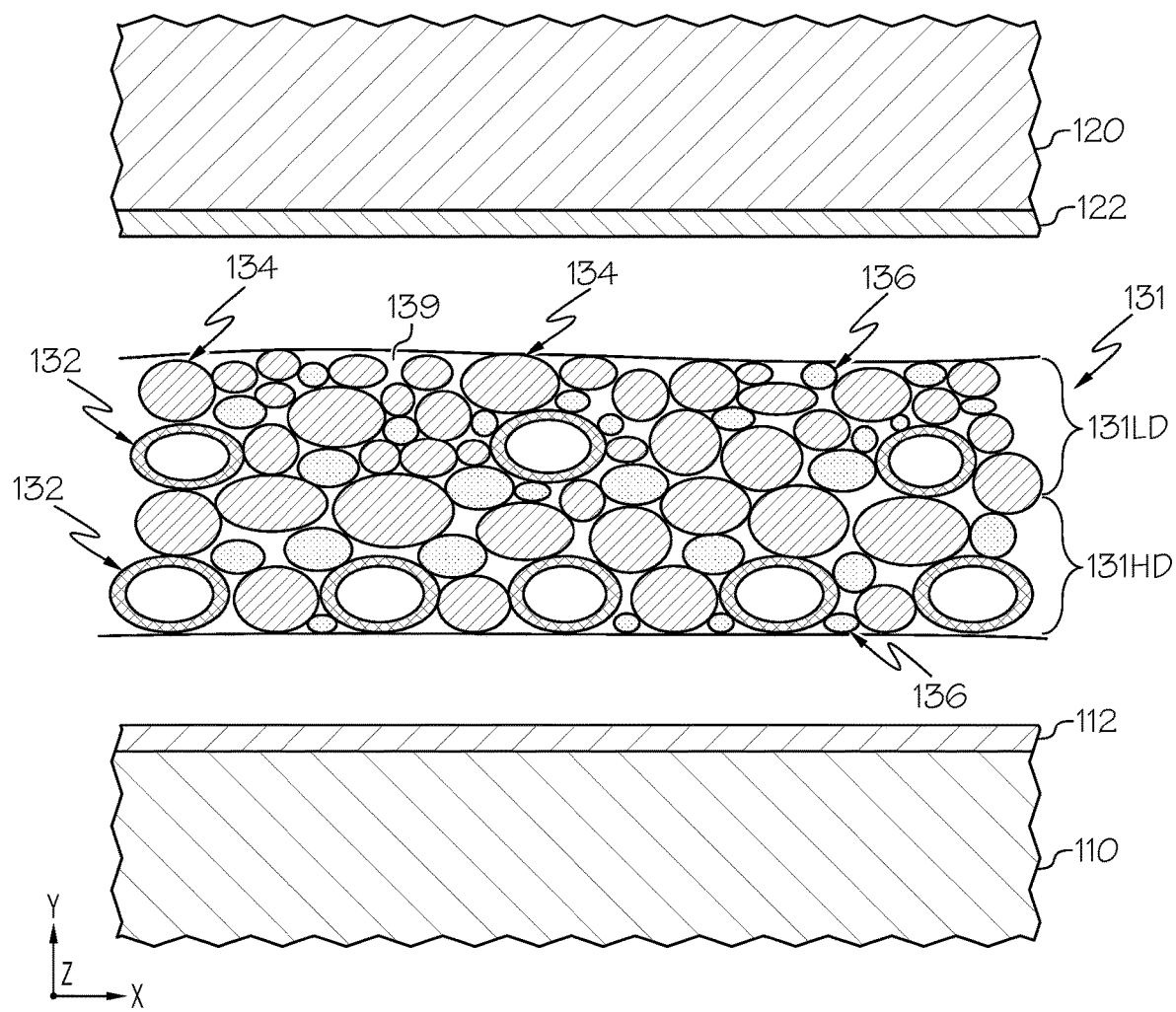
FIG. 7 schematically depicts an exploded view of FIG. 1 with a TLP bonding layer positioned between the metal substrate and the semiconductor device prior to TLP sintering according to one or more embodiments shown and described herein.
Figure 8:
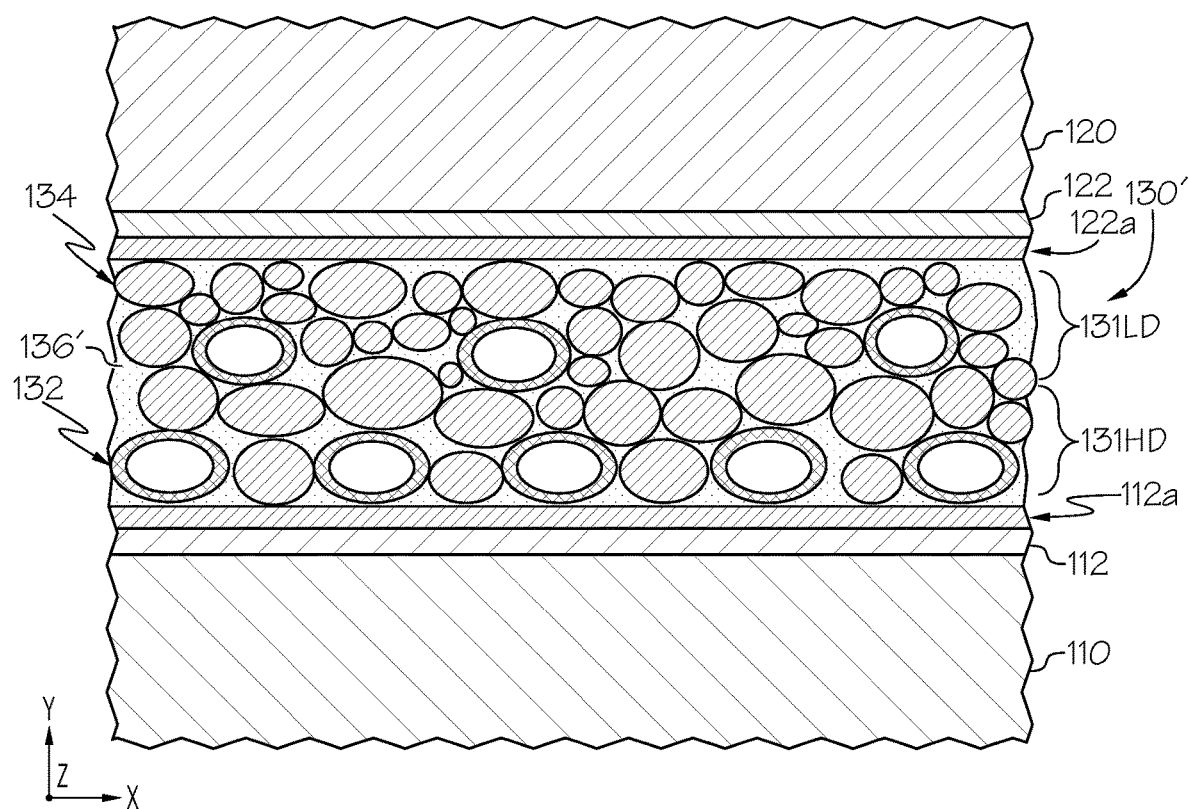
FIG. 8 schematically depicts an enlarged view of the TLP bond layer in FIG. 1 formed from the TLP bonding layer in FIG. 7 after TLP sintering.
Figure 9:
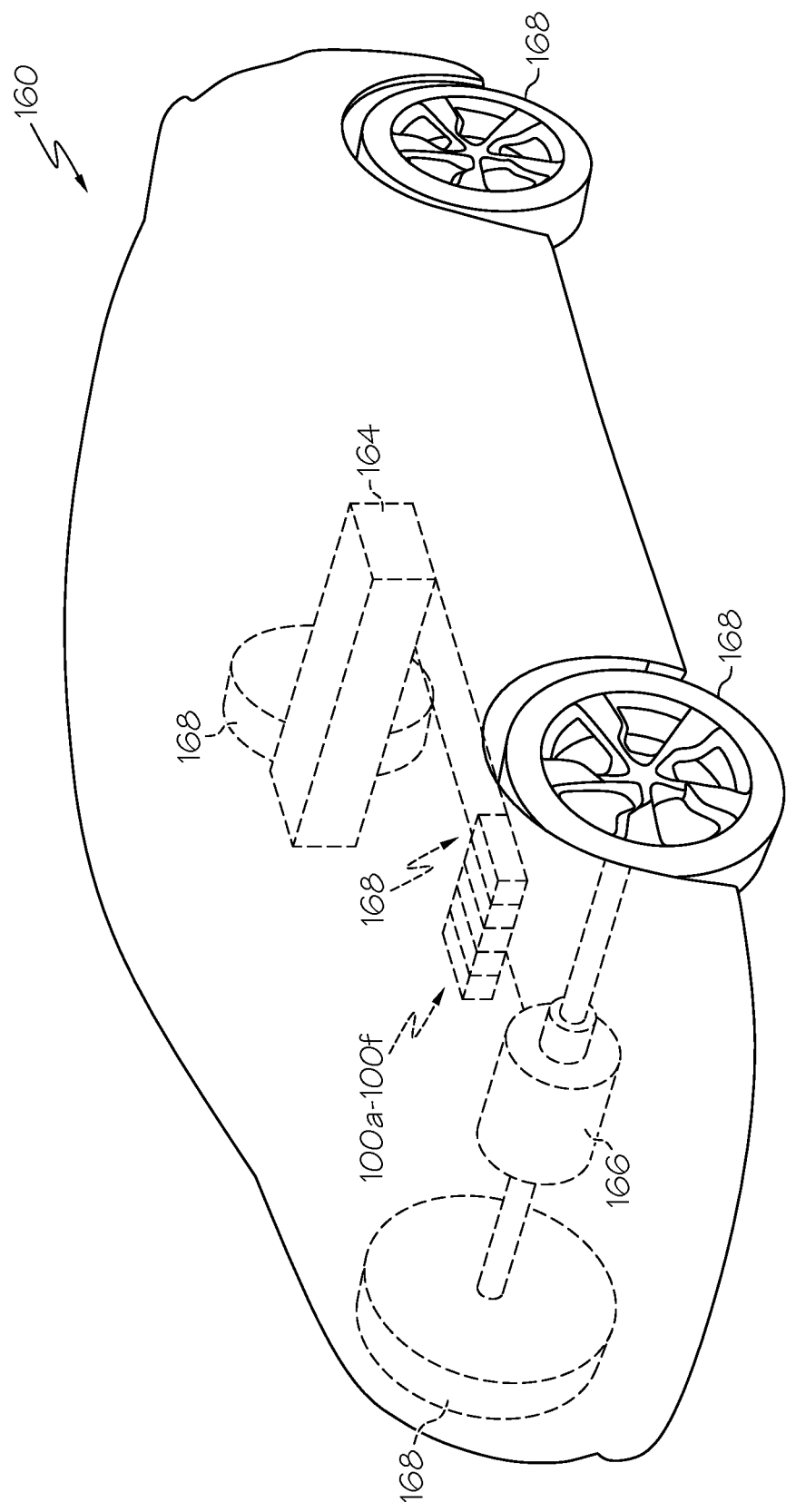
FIG. 9 schematically depicts a vehicle having a plurality of power electronics assemblies according to one or more embodiments shown and described herein.

Referring now to FIGS. 7-8, another embodiment of the TLP bonding layer 131 and TLP bond layer 130', respectively, in which a graded density of the first HMT particles 132 along a thickness of the TLP bonding layer 131 is illustrated. As used herein, the term density refers to the number of particles within a given layer of the TLP bonding layer 131 or TLP bond layer 130'. Referring particularly to FIG. 7, the TLP bonding layer 131 includes a first layer 131HD with a first number of first HMT particles 132, and a second layer 131LD with a second number of first HMT particles 132. The second number of first HMT particles 132 within the second layer 131LD is less than the first number of first HMT particles 132 within the first layer 131HD. Accordingly, the first layer 131HD has a higher density of the first HMT particles 132 than the second layer 131LD and the TLP bonding layer 131 has a graded density of the first HMT particles 132 along a thickness (Y-direction) of the TLP bonding layer 131.

Referring to FIG. 8, the TLP bond layer 130' formed from the TLP bonding layer 131 and thereby TLP bonding the semiconductor devices 120 to the metal substrate 110 is illustrated. As discussed above with respect to FIGS. 3 and 4, the TLP bond layer 130' is formed from the LMT particles 136 at least partially melting and forming an intermetallic matrix 136'. In embodiments, the intermetallic matrix 136' may be in the form of an intermetallic layer. The intermetallic matrix 136' is formed between individual first HMT particles 132, between individual second HMT particles 134, and between adjacent first HMT particles 132. Also, the LMT particles 136 at least partially melt and diffuse into the bonding layers 112, 122 to form intermetallic layers 112a, 122a, respectively, between the metal substrate 110 and the TLP bond layer 130', and the semiconductor devices 120 and the TLP bond layer 130', respectively. Although the bonding layers 112, 122 depicted in FIG. 8 have not been totally consumed by the intermetallic layers 112a, 122a, respectively, in embodiments the intermetallic bond layers 112a and/or 122a may totally consume the bonding layers 112 and/or 122, i.e., only a single layer of the intermetallic layers 112a and/or 122a may be present after the TLP bond layer 130' is formed. In other embodiments, the TLP intermetallic bond layers 112a and/or 122a may comprise no layers, i.e., all of the bonding layers 112 and/or 122 diffuse into the TLP bond layer 130 up', metal substrate 110 and/or semiconductor device 120 thereby resulting in a clearly defined TLP intermetallic bond layer 112a and/or 122a not being present.

Still referring to FIG. 8, it should be understood that the graded density of the first HMT particles 132 along the thickness of the TLP bond layer 130' may provide a graded stiffness along the thickness of the TLP bond layer 130'. In the alternative, or in addition to, the graded density of the first HMT particles 132 along the thickness of the TLP bond layer 130' may provide a graded ductility along the thickness of the TLP bond layer 130'.

The TLP bonding layer 131 with a graded density of the first HMT particles 132 along the thickness of the TLP bonding layer 131 may be formed using known or yet-to-be developed techniques that position or lay down multiple layers of TLP compositions having different quantities of first HMT particles 132. One non-limiting example includes additive manufacturing (3D printing), i.e., a first layer 131HD containing a first density of first HMT particles 132 is deposited onto the metal substrate 110 and then a second layer 131LD containing a second density of first HMT particles 132 is deposited onto the first layer 131HD. Another non-limiting example includes positioning a first thin foil formed from the LMT material (not shown) with the first density of first HMT particles 132 and second HMT particles 134 attached thereto onto the metal substrate 110, then positioning a second thin foil formed from the LMT material (not shown) with the second density of first HMT particles 132 and second HMT particles 134 attached thereto onto the first thin foil. It should be understood that the TLP bonding layer 131 may include more than two layers. And the arrangement of the first layer 131HD and second layer 131LD may be different than as depicted in FIGS. 7 and 8. That is, the TLP bonding layer 131 may be formed from any combination of layers having different densities of first HMT particles 132 such that the graded density of the first HMT particles 132 is present along a thickness of the TLP bonding layer 131. It should be also understood that the thicknesses of the layers, e.g., the thicknesses of the first layer 131HD and the second layer 131LD may be equal, or in the alternative, may not be equal.

The TLP bond layers 130' described herein compensate for thermally-induced stresses, e.g., thermal cooling stresses, resulting from fabrication (e.g., TLP sintering) and operational conditions (e.g., transient electric loads causing high changes in temperature). Because the metal substrate 110 and semiconductor devices 120 of the power electronics assembly 100 are made of differing materials, differences in the CTE for each material may cause large thermally-induced stresses within the metal substrate 110, semiconductor devices 120 and TLP bond layer 130'. It should be understood that the large thermally-induced stresses may result in failure of the power electronics assembly 100 due to fracturing of the metal substrate 110 or failure of a traditional TLP bonding material (e.g., delamination) between the metal substrate 110 and one or both of the semiconductor devices 120.

The use of the TLP bond layer 130' to TLP bond the metal substrate 110 to the semiconductor devices 120 alleviates or mitigates such stresses. That is, the TLP bond layer 130' described herein compensates for the thermal expansion and contraction experienced by the metal substrate 110 and semiconductor devices 120. In some embodiments, the TLP bond layer 130' described herein compensates for the thermal expansion and contraction experienced by the metal substrate 110 and semiconductor devices 120 with the plurality of first HMT particles 132 providing localized variation in stiffness and/or ductility between the metal substrate 110 and semiconductor devices 120. In other embodiments, the TLP bond layer 130' described herein compensates for the thermal expansion and contraction experienced by the metal substrate 110 and semiconductor devices 120 with the TLP bond layer 130' having a graded stiffness and/or ductility provided by a graded average diameter of the first HMT particles 132 along the thickness (Y-direction) of the TLP bond layer 130'. In still other embodiments, the TLP bond layer 130' described herein compensates for the thermal expansion and contraction experienced by the metal substrate 110 and semiconductor devices 120 with the TLP bond layer 130' having a graded stiffness and/or ductility provided by a graded density of the first HMT particles 132 along the thickness of the TLP bond layer 130'. The TLP bond layer 130', with the variation in localized stiffness and/or ductility or the graded stiffness and/or ductility across its thickness, allows the TLP bond layer 130' to plastically deform and not delaminate due to the CTE mismatch between the metal substrate 110 and semiconductor devices 120. Also, the TLP bond layer 130' provides sufficient stiffness such that the semiconductor devices 120 are adequately secured to the metal substrate 110 for subsequent manufacturing steps performed on the semiconductor devices 120. The TLP bond layer 130' also provides sufficient high temperature bonding strength between the metal substrate 110 and semiconductor devices 120 during operating temperatures approaching and possibly exceeding 200° C.

Generally, the TLP bond layer 130' comprises a flat thin layer date. As non-limiting examples, the thickness of the TLP bond layer 130' may be between about 25 micrometers (μm) and about 200 μm. In embodiments, the TLP bond layer 130' has a thickness between about 50 μm and about 150 μm. In other embodiments, the TLP bond layer 130' has a thickness between about 75 μm and 125 μm, for example a thickness of 100 μm.

As stated above, the metal substrates and power electronics assemblies described herein may be incorporated into an inverter circuit or system that converts direct current electrical power into alternating current electrical power and vice versa depending on the particular application. For example, in a hybrid electric vehicle application as illustrated in FIG. 8, several power electronics assemblies 100a-100f may be electrically coupled together to form a drive circuit that converts direct current electrical power provided by a bank of batteries 164 into alternating electrical power that is used to drive an electric motor 166 coupled to the wheels 168 of a vehicle 160 to propel the vehicle 160 using electric power. The power electronics assemblies 100a-100f used in the drive circuit may also be used to convert alternating current electrical power resulting from use of the electric motor 166 and regenerative braking back into direct current electrical power for storage in the bank of batteries 164.

Power semiconductor devices utilized in such vehicular applications may generate a significant amount of heat during operation, which require bonds between the semiconductor devices and metal substrates that can withstand higher temperatures and thermally-induced stresses due to CTE mismatch. The thermal stress compensation layers described and illustrated herein may compensate for the thermally-induced stresses generated during thermal bonding of the semiconductor devices to the metal substrate and/or operation of the power semiconductor devices with a constant or graded stiffness across the thickness of the thermal stress compensation layers while also providing a compact package design.

It should now be understood that the multilayer composites incorporated into the power electronics assemblies and vehicles described herein may be utilized to compensate thermally-induced stresses due to CTE mismatch without the need for additional interface layers, thereby providing for a more compact package design with reduced thermal resistance.

It is noted that the terms "about" and "generally" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

The invention claimed is:

1. A method, comprising:
 positioning a TLP bonding layer between a metal substrate and a semiconductor device to form an assembly, the TLP bonding layer comprising first HMT particles, second HMT particles, and LMT particles, wherein:
  each of the first HMT particles comprise a core-shell structure having a core formed from a first HMT material and a shell formed from a second HMT material, each of the second HMT particles is formed from a third HMT material, and
  each of the plurality of LMT particles is formed from a LMT material; and
 heating the assembly to a TLP sintering temperature greater than a melting point of the LMT material to cause the LMT particles to at least partially melt and form a TLP intermetallic layer between the first and second HMT particles, the metal substrate, and the semiconductor device, forming a TLP bond layer between the metal substrate and the semiconductor device having a variation in stiffness of the TLP bond layer,
 wherein, after heating the assembly, the TLP bonding layer has a graded stiffness along the thickness of the TLP bonding layer between the metal substrate and the semiconductor device.

2. The method of claim 1, wherein positioning the TLP bonding layer comprises arranging the first HMT particles within the TLP bonding layer to have a graded average diameter along a thickness of the TLP bonding layer.

3. The method of claim 1, wherein positioning the TLP bonding layer comprises arranging the first HMT particles within the TLP bonding layer to have a graded density along a thickness of the TLP bonding layer.

4. The method of claim 3, wherein positioning the TLP bonding layer further comprises positioning or laying down a plurality of layers of TLP compositions having different quantities of first HMT particles to achieve the graded density along the thickness of the TLP bonding layer.

5. The method of claim 3, wherein positioning the TLP bonding layer to have a graded density further comprises:
 depositing a first layer comprising a first density of the first HMT particles onto the metal substrate; and
 depositing a second layer comprising a second density of the first HMT particles onto the first layer.

6. The method of claim 5, wherein a thickness of the first layer is equal to a thickness of the second layer.

7. The method of claim 5, wherein a thickness of the first layer is not equal to a thickness of the second layer.

8. The method of claim 3, wherein positioning the TLP bonding layer to have a graded density further comprises:
 positioning a first thin foil, formed from the LMT material, onto the metal substrate, wherein a first density of the first HMT particles and the second HMT particles are attached to the first thin foil; and
 positioning a second thin foil, formed from the LMT material, onto the first thin foil, wherein a second density of first HMT particles and second HMT particles are attached to the second thin foil.

9. The method of claim 8, wherein a thickness of the first thin foil is equal to a thickness of the second thin foil.

10. The method of claim 8, wherein a thickness of the first thin foil is not equal to a thickness of the second thin foil.

11. The method of claim 1, further comprising incorporating the assembly into an inverter circuit.

12. The method of claim 1, wherein:
 the first HMT material is nickel, silver, copper, aluminum, or an alloy thereof;
 the second HMT material is nickel, silver, copper, or an alloy thereof;
 the third HMT material is nickel, silver, copper, aluminum, or an alloy thereof; and
 the LMT material is tin, indium, or an alloy thereof.

13. A method, comprising:
 providing a metal substrate;
 positioning a first thin foil, formed from a LMT material, onto the metal substrate, wherein a first density of first HMT particles and second HMT particles are attached to the first thin foil, wherein the first HMT particles comprise a core-shell structure having a core formed from a first HMT material and a shell formed from a second HMT material and the second HMT particles are formed from a third HMT material;
 positioning a second thin foil, formed from the LMT material, onto the first thin foil, wherein a second density of first HMT particles and second HMT particles are attached to the second thin foil;
 placing a semiconductor device over the second thin foil to form an assembly;
 heating the assembly to a TLP sintering temperature greater than a melting point of the LMT material to cause LMT particles in the LMT material to at least partially melt and form a TLP intermetallic layer between the first and second HMT particles, the metal substrate, and the semiconductor device, thereby forming a TLP bond layer between the metal substrate and the semiconductor device having a variation in stiffness of the TLP bond layer; and
 incorporating the assembly into an invertor circuit.

14. The method of claim 13, wherein, after heating the assembly, the TLP bonding layer has a graded stiffness between the metal substrate and the semiconductor device.

15. The method of claim 13, wherein positioning the first thin foil and positioning the second thin foil is completed such that the first HMT particles within the TLP bonding layer have a graded average diameter along a thickness of the TLP bond layer resulting therefrom.

16. The method of claim 13, wherein a thickness of the first thin foil is equal to a thickness of the second thin foil.

17. The method of claim 13, wherein a thickness of the first thin foil is not equal to a thickness of the second thin foil.

18. A method, comprising:
   positioning a TLP bonding layer comprising a first layer having a first density of first HMT particles and a second layer having a second density of the first HMT particles between a metal substrate and a semiconductor device to form an assembly, the TLP bonding layer further comprising second HMT particles and LMT particles, wherein:
   each of the first HMT particles comprise a core-shell structure having a core formed from a first HMT material and a shell formed from a second HMT material,
   each of the second HMT particles is formed from a third HMT material, and
   each of the plurality of LMT particles is formed from a LMT material;
   heating the assembly to a TLP sintering temperature greater than a melting point of the LMT material to cause the LMT particles to at least partially melt and form a TLP intermetallic layer between the first and second HMT particles, the metal substrate, and the semiconductor device, forming a TLP bond layer between the metal substrate and the semiconductor device having a variation in stiffness of the TLP bond layer; and
   incorporating the assembly into an invertor circuit,
   wherein, after heating the assembly, the TLP bonding layer has a graded stiffness along the thickness of the TLP bonding layer between the metal substrate and the semiconductor device.

* * * * *